US011749660B2

(12) United States Patent
Liu (10) Patent No.: US 11,749,660 B2
(45) Date of Patent: Sep. 5, 2023

(54) DISPLAY PANEL, CHIP ON FILM, DISPLAY EQUIPMENT, AND MANUFACTURING METHOD (71) Applicant: BEIJING XIAOMI MOBILE SOFTWARE CO., LTD., Beijing (CN)

(72) Inventor: Weiguang Liu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 150 days.

(21) Appl. No.: 17/217,842

(22) Filed: Mar. 30, 2021

(65) Prior Publication Data
US 2021/0407982 A1 Dec. 30, 2021

(30) Foreign Application Priority Data

Jun. 30, 2020 (CN) .......................... 202010622527.3

(51) Int. Cl.
H01L 25/18 (2023.01)
G09G 3/20 (2006.01)
H01L 23/498 (2006.01)
H01L 25/00 (2006.01)
G02F 1/1345 (2006.01)

(52) U.S. Cl.
CPC ............... H01L 25/18 (2013.01); G09G 3/20 (2013.01); H01L 23/4985 (2013.01); H01L 23/49838 (2013.01); H01L 25/50 (2013.01); G02F 1/13452 (2013.01); G02F 1/13458 (2013.01)

(58) Field of Classification Search
CPC ............... H01L 25/18; H01L 23/49838; H01L 23/4985; H01L 25/50; G09G 3/20; G02F 1/13452; G02F 1/13458
See application file for complete search history.

(56) References Cited

U.S. PATENT DOCUMENTS

2002/0044251 A1* 4/2002 Togashi .............. G02F 1/13452
349/149
2015/0228706 A1 8/2015 Lee
2017/0207190 A1* 7/2017 Tsukao .................... H01L 24/17

FOREIGN PATENT DOCUMENTS

KR 20080055296 A 6/2008

OTHER PUBLICATIONS

Extended European Search Report in the European Application No. 21165107.0, dated Jul. 22, 2021, (16p).

* cited by examiner

Primary Examiner — Afroza Chowdhury
(74) Attorney, Agent, or Firm — Arch & Lake LLP (57) ABSTRACT The display panel includes: a plurality of first connection terminals, the first connection terminals being arranged into a first terminal row along a second direction, long edges of the first connection terminals being oriented along a first direction; and a plurality of second connection terminals, the second connection terminals being arranged into a second terminal row along the second direction, long edges of the second connection terminals being oriented along the second direction, the first terminal row and the second terminal row being arranged side by side along the first direction, the second direction not paralleling the first direction, the first connection terminals and the second connection terminals being connected respectively to different display rows or display columns within a display region of the display panel, and configured respectively to receive a drive signal driving display by the display panel.

15 Claims, 6 Drawing Sheets

The first connection terminals of the display panel of any forgoing embodiment are aligned to the third connection terminals of the chip on film of any forgoing embodiment. The second connection terminals of the display panel are aligned to the fourth connection terminals of the chip on film — S101

The display equipment is formed by establishing an electrical connection between the first connection terminals and the third connection terminals through a conductive glue, and establishing an electrical connection between the second connection terminals and the fourth connection terminals through the conductive glue — S102

DISPLAY PANEL, CHIP ON FILM, DISPLAY EQUIPMENT, AND MANUFACTURING METHOD

CROSS-REFERENCE TO RELATED APPLICATIONS

This application is based on and claims priority to Chinese Patent Application No. 202010622527.3 filed on Jun. 30, 2020, the disclosure of which is hereby incorporated by reference in its entirety for all purposes.

BACKGROUND

Figure 1A:
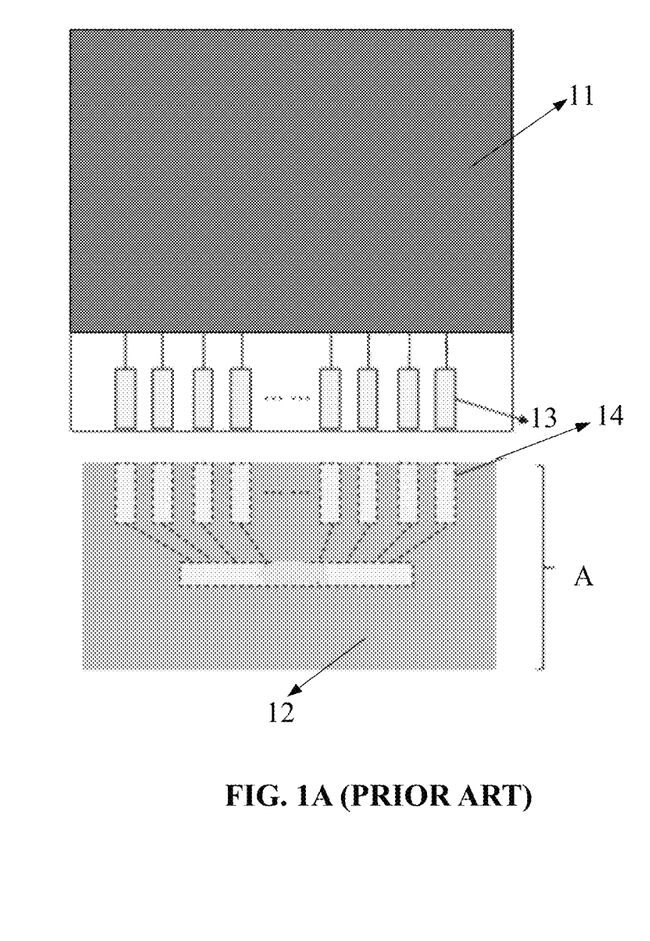
FIG. 1A is a bottom view of part of a structure of display equipment in prior art.
Figure 1B:
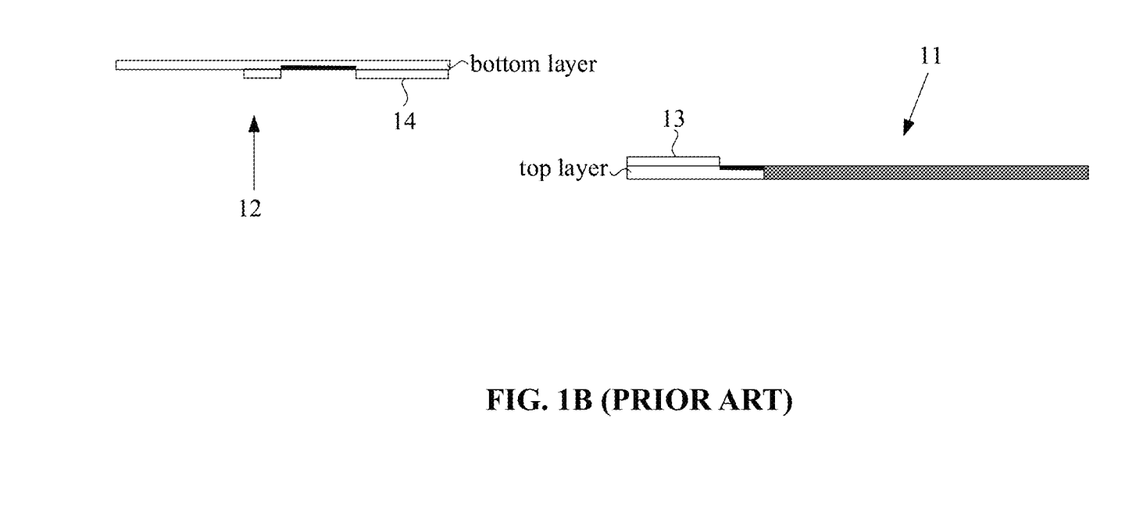
FIG. 1B is a side view of the part of the structure of the display equipment in FIG. 1A.

As shown in FIG. 1A and FIG. 1B, in an existing High Definition (HD) or Full High Definition (FHD) display panel, a Display Driver Integrated Circuit (DDIC) chip is bonded onto a Flexible Printed Circuit (FPC), which is a chip on FPC (COF for short) scheme. Specifically, all connection terminals (i.e., bonding pads) are arranged into a row. In FIG. 1A, connection terminals 13, shown as solid-line frames, on a display panel 11 are on an upper layer (i.e., a top layer), and connection terminals 14, shown as dashed frames, on a COF 12 are on a lower layer (i.e., a bottom layer). The COF adopts a single layer of COF, i.e., the region A is a single layer.

However, with an increasing requirement on high resolution of display panels, resolution of HD and FHD display panels is no longer satisfactory. In order to acquire higher resolution, more connection terminals are required. Increase in the number of connection terminals certainly will result in a wider border of a display panel, causing a large screen-to-body ratio of the display panel, impacting Industrial Design (ID) of an entire display device.

SUMMARY

The present disclosure relates to field of electronic technology. The present disclosure provides a display panel, a chip on film, display equipment, and a manufacturing method.

According to an aspect of the present disclosure, a display panel is provided, including:

a plurality of first connection terminals, the first connection terminals being arranged into a first terminal row along a second direction, long edges of the first connection terminals being oriented along a first direction; and a plurality of second connection terminals, the second connection terminals being arranged into a second terminal row along the second direction, long edges of the second connection terminals being oriented along the second direction. The first terminal row and the second terminal row are arranged side by side along the first direction. The second direction does not parallel the first direction.

The first connection terminals and the second connection terminals are connected respectively to different display rows or display columns within a display region of the display panel, and are configured respectively to receive a drive signal driving display by the display panel.

According to an aspect of the present disclosure, a chip on film is provided, including:

a flexible film;

a plurality of first chip terminals, located on the flexible film, the first chip terminals being arranged into a third terminal row along a second direction, long edges of the first chip terminals being oriented along a first direction;

a plurality of second chip terminals, located on the flexible film, the second chip terminals being arranged into a fourth terminal row along the second direction, long edges of the second chip terminals being oriented along the second direction, the third terminal row and the fourth terminal row being arranged side by side along the first direction, the second direction not paralleling the first direction; and a Display Driver Integrated Circuit (DDIC), located on the flexible film. The DDIC is connected respectively to the first chip terminals and the second chip terminals, and is configured to provide a drive signal to a display panel connected to the chip on film.

According to an aspect of the present disclosure, Display equipment is provided, including:

the display panel of any embodiment herein; and the chip on film of any embodiment herein.

The third connection terminals of the chip on film are electrically connected to the first connection terminals of the display panel.

The fourth connection terminals of the chip on film are electrically connected to the second connection terminals of the display panel.

According to an aspect of the present disclosure, a method for manufacturing display equipment is provided, including:

aligning the first connection terminals of the display panel of any embodiment herein to the third connection terminals of the chip on film of any embodiment herein, and aligning the second connection terminals of the display panel to the fourth connection terminals of the chip on film; and forming the display equipment by establishing an electrical connection between the first connection terminals and the third connection terminals through a conductive glue, and establishing an electrical connection between the second connection terminals and the fourth connection terminals through the conductive glue.

According to an aspect of the present disclosure, a device for manufacturing display equipment is provided, and includes a processor and a memory.

The memory is configured for storing instructions executable by the processor.

The processor is configured to implement the method for manufacturing display equipment according to any embodiment herein.

According to an aspect of the present disclosure, a non-transitory computer-readable storage medium has stored therein computer program instructions which, when executed by a processor, implement the method for manufacturing display equipment according to any embodiment herein.

It should be understood that the general description above and the elaboration below are exemplary and explanatory only, and do not limit the present disclosure.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. In the drawings, for the sake of clarity, the thickness of layers, films, panels, regions, etc., may be exaggerated and not every structual detail may be shown. The implementations set forth in the following description of exemplary embodiments do not represent all implementations consistent with the invention. Instead, they are merely examples of devices and methods consistent with aspects related to the invention as recited in the appended claims. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

Note that although a term such as first, second, third may be adopted in an embodiment herein to describe various kinds of information, such information should not be limited to such a term. Such a term is merely for distinguishing information of the same type. For example, without departing from the scope of the embodiments herein, the first information may also be referred to as the second information. Similarly, the second information may also be referred to as the first information. Depending on the context, a "if" as used herein may be interpreted as "when" or "while" or "in response to determining that".

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

As used herein, the term "if" or "when" may be understood to mean "upon" or "in response to" depending on the context. These terms, if appear in a claim, may not indicate that the relevant limitations or features are conditional or optional.

The terms "module," "sub-module," "circuit," "sub-circuit," "circuitry," "sub-circuitry," "unit," or "sub-unit" may include memory (shared, dedicated, or group) that stores code or instructions that can be executed by one or more processors. A module may include one or more circuits with or without stored code or instructions. The module or circuit may include one or more components that are directly or indirectly connected. These components may or may not be physically attached to, or located adjacent to, one another.

A unit or module may be implemented purely by software, purely by hardware, or by a combination of hardware and software. In a pure software implementation, for example, the unit or module may include functionally related code blocks or software components, that are directly or indirectly linked together, so as to perform a particular function.

In addition, described characteristics, structures or features may be combined in one or more implementation modes in any proper manner. In the following descriptions, many details are provided to allow a full understanding of embodiments herein. However, those skilled in the art will know that the technical solutions of embodiments herein may be carried out without one or more of the details; alternatively, another method, component, device, option, etc., may be adopted. Under other conditions, no detail of a known structure, method, device, implementation, material or operation may be shown or described to avoid obscuring aspects of embodiments herein.

A block diagram shown in the accompanying drawings may be a functional entity which may not necessarily correspond to a physically or logically independent entity. Such a functional entity may be implemented in form of software, in one or more hardware modules or integrated circuits, or in different networks and/or processor devices and/or microcontroller devices.

A terminal may sometimes be referred to as a smart terminal. The terminal may be a mobile terminal. The terminal may also be referred to as User Equipment (UE), a Mobile Station (MS), etc. A terminal may be equipment or a chip provided therein that provides a user with a voice and/or data connection, such as handheld equipment, onboard equipment, etc., with a wireless connection function. Examples of a terminal may include a mobile phone, a tablet computer, a notebook computer, a palm computer, a Mobile Internet Device (MID), wearable equipment, Virtual Reality (VR) equipment, Augmented Reality (AR) equipment, a wireless terminal in industrial control, a wireless terminal in unmanned drive, a wireless terminal in remote surgery, a wireless terminal in a smart grid, a wireless terminal in transportation safety, a wireless terminal in smart city, a wireless terminal in smart home, etc.

Figure 2A:
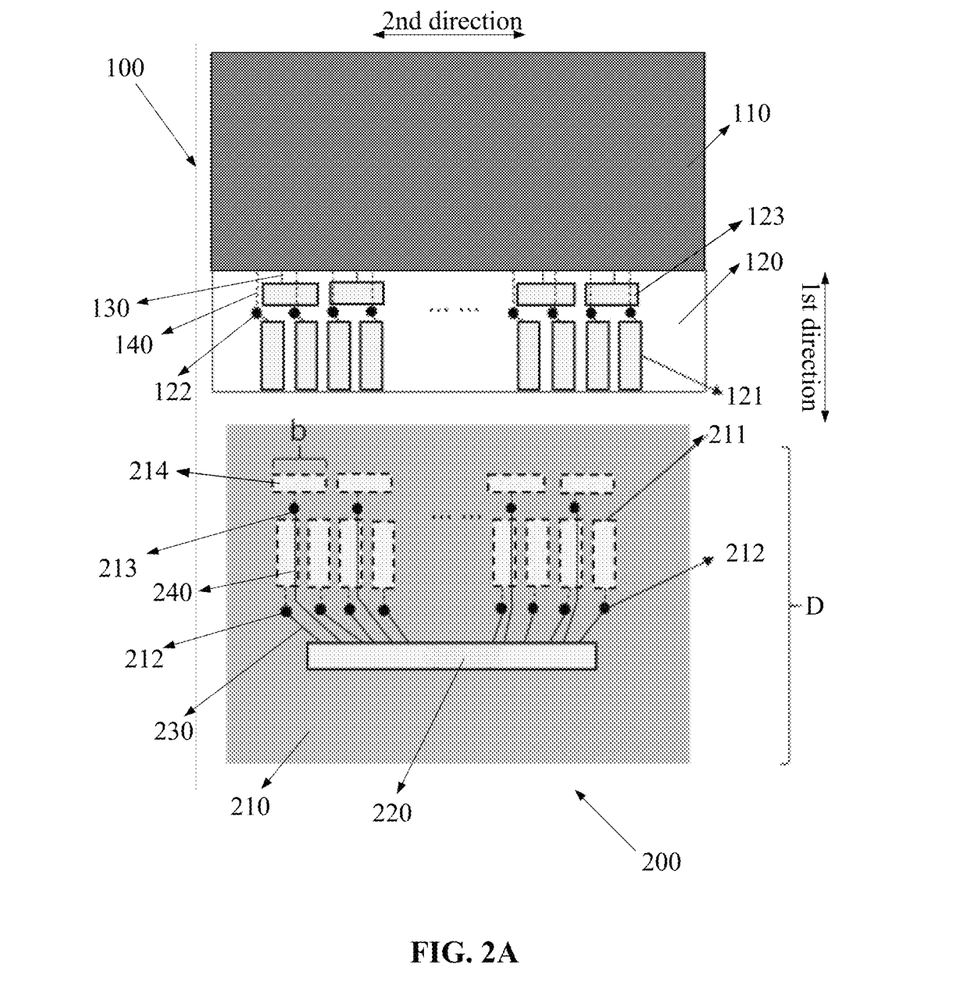
FIG. 2A is a bottom view of part of a structure of display equipment according to an exemplary embodiment.

In description of the present disclosure, it is to be understood that positional or locational relationships indicated by terms "upper", "lower", "vertical", and "horizontal" are based on positional or locational relationships shown FIG. 2A. The term "front" refers to a side facing the reader. The term "back" refers to the opposite side of the front. The first direction and the second direction are as shown in FIG. 2A.

In order to increase the number of connection terminals and improve the resolution, such as to implement Ultra High Definition (UHD) resolution, connection terminals on a display panel and a chip on film may be divided, along a first direction, into a plurality of rows, with long edges of connection terminals in each row all being oriented along the first direction. However, such a design may lead to wiring crosstalk, increasing difficulty in a manufacturing process. Moreover, more connection terminals will result in a wider border of the display panel, further reducing the screen-to-body ratio of the display panel.

Embodiments of the present disclosure provide a display panel.

The display panel includes a plurality of first connection terminals 121. The first connection terminals 121 are arranged into a first terminal row along a second direction. Long edges of the first connection terminals 121 are oriented along a first direction.

The display panel includes a plurality of second connection terminals 123. The second connection terminals 123 are arranged into a second terminal row along the second direction. Long edges of the second connection terminals 123 are oriented along the second direction. The first terminal row and the second terminal row are arranged side by side along the first direction. The second direction does not parallel the first direction.

The first connection terminals 121 and the second connection terminals 123 are connected respectively to different display rows or display columns within a display region 110 of the display panel 100, and are configured respectively to receive a drive signal driving display by the display panel 100.

In embodiments of the present disclosure, the second direction is not parallel to the first direction, which includes that: the angle between the first direction and the second direction is an acute angle between 0° and 90°. Alternatively, the angle between the first direction and the second direction is an obtuse angle between 90° and 180°; or the first direction is perpendicular to the second direction, i.e., the angle between the first direction and the second direction is 90°. By orienting the long edges of the first connection terminals 121 and the second connection terminals 123 in a nonparallel mode, compared to orienting the long edges of both the first connection terminals 121 and the second connection terminals 123 side by side along the first direction, the width occupied by the connection terminals in the first direction is reduced. Such arrangement of the first connection terminals 121 and the second connection terminals 123 reduces space occupation, reducing a border area of the display panel 100, improving a borderless effect and a screen-to-body ratio.

Generally, the more display rows and display columns of the display panel 100 there are, the higher the resolution, and correspondingly, the more connection terminals.

Non-restrictively, as shown in FIG. 2A, each connection terminal is roughly shown as a rectangle, with a long edge and a short edge. In actual application, connection terminals arranged in one mode are distributed in one row.

There may be two or more first connection terminals 121 and two or more second connection terminals 123. Two or more first connection terminals 121 are arranged into a first terminal row. Two or more second connection terminals 123 are arranged into a second terminal row. The first terminal row and the second terminal row are arranged to form different terminal rows. Multiple terminal rows are arranged side by side along the first direction. Two terminal rows may be distributed on the display panel 100, i.e., the display panel includes a first terminal row and a second terminal row. As shown in FIG. 2A, long edges of all connection terminals in one row are arranged along the first direction, i.e., oriented vertically. Long edges of connection terminals in the other row are arranged along the second direction, i.e., oriented horizontally. Further, three or more terminal rows may be provided as needed. Numbers of the first terminal rows and of the second terminal rows may be set separately respectively as needed. At this time, rows of the first connection terminals 121 and rows of the second connection terminals 123 may be distributed alternately successively. For example, a first row is counted, starting from the row close to the edge of the display panel 100 towards the centre of the display panel 100, followed by the second row, the third row, . . . , and so on. The first row is multiple first connection terminals 121 oriented vertically. The second row is multiple second connection terminals 123 oriented horizontally. The third row is multiple first connection terminals 121 oriented vertically. The fourth row is multiple second connection terminals 123 oriented horizontally, . . . , and so on. Alternatively, instead of the successive alternate mode, some random rows of connection terminals may be oriented vertically or horizontally, provided that the space of the display panel 100 can be fully used.

Optionally, the display panel 100 may be a Liquid Crystal Display (LCD) or an Organic Light-Emitting Diode (OLED). The display panel 100 may be a hard screen, and may also be a flexible screen.

In the first direction, the correspondence between the first connection terminals 121 and the second connection terminals 123 is not limited. Non-restrictively, illustrated with the example shown in FIG. 2A, each horizontally oriented second connection terminal 123 corresponds to two vertically oriented first connection terminals 121 below. Of course, each horizontally oriented second connection terminal 123 may also correspond to one or three vertically oriented first connection terminals 121 below.

In other optional embodiments, the display panel 100 may further include:

an edge region 120, located outside the display region 110.

Both the first connection terminals 121 and the second connection terminals 123 may be located within the edge region 120.

The display region 110 may be configured to display an image. The edge region 120 may not display any image, and may be configured for providing a signal element and a connection line.

Such a signal element or connection line may be configured at least to provide a drive signal to the display panel 100.

As shown in FIG. 2A, the edge region 120 may be located at the bottom of the display region 110, and may also be located at the top of the display region 110. Alternatively, the edge region 120 may also be located on either side of the display region 110.

The edge region 120 may be located on the same plane as the display region 110. Alternatively, the edge region 120 and the display region 110 may be located on different planes.

Substrates of the display region 110 and the edge region 120 may be of the same type. For example, for a hard-screen display panel 100, substrates of the display region 110 and the edge region 120 may both be made of glass, and the first connection terminals 121 and the second connection terminals 123 may be formed on the glass substrate. Alternatively, for a flexible-screen display panel 100, substrates of the display region 110 and the edge region 120 may both be made of flexible material such as plastic, and the first connection terminals 121 and the second connection terminals 123 may be formed on the plastic substrate.

The substrates of the display region 110 and the edge region 120 may also be different substrates. For example, the substrate of the display region 110 may be made of glass, and the substrate of the edge region 120 may be made of flexible material such as a polyimide or a polyester film. At this time, the flexible edge region 120 may be pressed onto the glass substrate of the display region 110 using an anisotropic conductive glue adopting a hot pressing process, forming a Film On Glass (FOG).

An edge region 120 with a flexible substrate is bendable, and the edge region 120 may be bent to the back of the display panel 100, further reducing the border of the display panel 100, improving a borderless effect.

In other optional embodiments, a first via hole 122 is formed in the edge region 120.

Both the first connection terminals 121 and the second connection terminals 123 may be located on a first surface of the edge region.

A distance between the first connection terminals 121 and the display region 110 may be greater than a distance between the second connection terminals 123 and the display region 110.

The first connection terminals 121 may be connected, through the first vial hole 122, to a first connection line 140 located on a second surface of the edge region 120. The first connection line 140 may be connected to the display rows or the display columns. The second surface may be an opposite surface of the first surface.

In embodiments of the present disclosure, conductive metal is provided in each via hole.

The number of first via holes 122 may be selected as needed, and is not used as a limit to the present disclosure. Non-restrictively, as shown in FIG. 2A, the number of first via holes 122 may be equal to the number of first connection terminals 121. A first via hole 122 may be provided above each first connection terminal 121. The first connection terminals 121 may be in one-to-one correspondence with the first via holes 122.

Figure 2B:
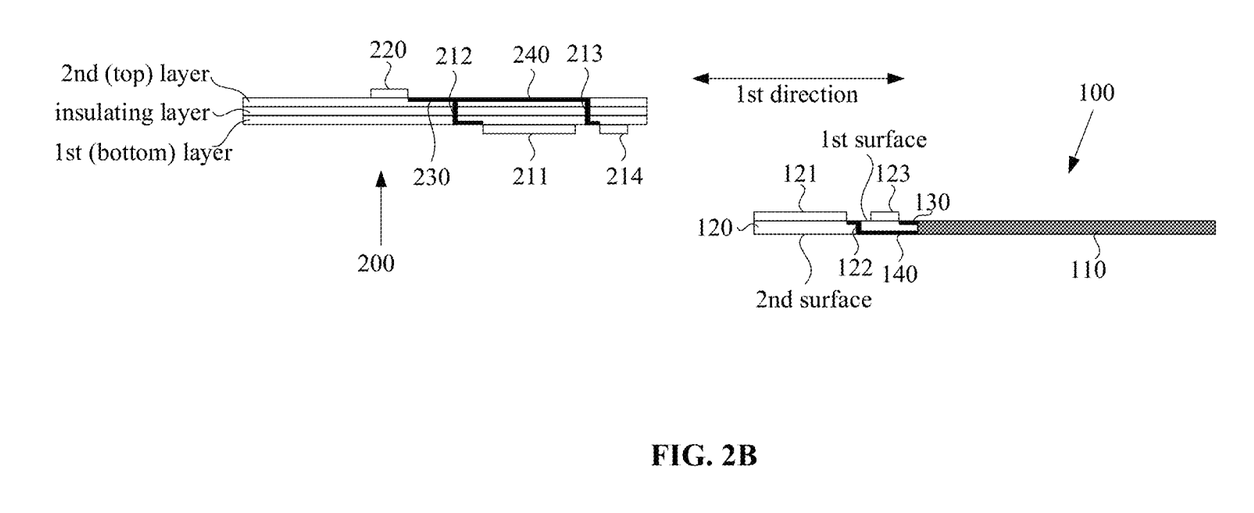
FIG. 2B is a side view of the part of the structure of the display equipment in FIG. 2A.

Non-restrictively, as shown in FIG. 2A and FIG. 2B, taking a display panel 100 provided with two rows of connection terminals as an example, the first connection terminals 121 may be closer to the edge of the display region 110, and the second connection terminals 123 may be located in spacing between the first connection terminals 121 and the display region 110.

A first connection line 140 may be configured to implement the electrical connection between the display region 110 and a first connection terminal 121. With a first via hole 122, a first connection line 140 may be wired through the second surface, and does not have to completely go through the first surface, thereby reducing wiring crosstalk, reducing process difficulty.

Compared to the solution shown in FIG. 2A and FIG. 2B, the first connection line 140 also does not have to pass through the spacing between two adjacent second connection terminals 123 in order to avoid the second connection terminals 123. A first connection line 140 may even coincide with a second connection terminal 123 in the thickness direction of the edge region 120. As shown in FIG. 2A, a dashed line represents that a first connection line 140 is on the back of the edge region 120, i.e., the second surface of the edge region 120. The first connection lines 140 may overlap the second connection terminals 123. Therefore, in embodiments of the present disclosure, the spacing between adjacent second connection terminals 123 on the same row as well as the spacing between two adjacent first connection terminals 121 on the same row may be smaller, saving space in the second direction. More connection terminals may be arranged within the limited space in the second direction, such that high resolution such as UHD resolution can be implemented, reducing abnormality caused by wiring crosstalk, reducing difficulty in a manufacturing process.

In other optional embodiments, the first connection terminals 121 and the second connection terminals 123 are spaced apart from one another.

The first via hole 122 may be located in spacing between the first connection terminals 121 and the second connection terminals 123.

As shown in FIG. 2A, a first via hole 122 may be located above a first connection terminal 121, and below a corresponding second connection terminal 123.

Optionally, a first via hole 122 may also be provided directly on a first connection terminal 121, such that the spacing between the first connection terminals 121 and the second connection terminals 123 may further be reduced, further reducing space in the first direction in the edge region, reducing the size of the lower border of the display panel 100.

In other optional embodiments, the second connection terminals 123 are connected to the display rows or the display columns through a second connection line 130. The second connection line 130 may be located on the second surface or the first surface of the edge region 120.

As shown in FIG. 2A and FIG. 2B, a second connection line 130 may be configured to implement the electrical connection between a display row or a display column and a second connection terminal 123. If the second connection terminals 123 are close to the display region 110, the second connection lines 130 may be provided directly on the first surface. In case the second connection terminals 123 are far from the display region 110, or wiring through the first surface is inconvenient, the second connection lines may also be provided on the second surface, and then connected by a via hole (not shown).

Embodiments of the present disclosure further provide a chip on film, including:

a flexible film 210;

a plurality of third connection terminals 211, located on the flexible film 210, the first connection terminals 211 being arranged into a third terminal row along a second direction, long edges of the third connection terminals 211 being arranged along a first direction, where the third connection terminals may also be referred as the first chip terminals;

a plurality of fourth connection terminals 214, located on the flexible film 210, the fourth connection terminals being arranged into a fourth terminal row along the second direction, long edges of the fourth connection terminals 214 being oriented along the second direction, the third terminal row 211 and the fourth terminal row 214 being arranged side by side along the first direction, the second direction not paralleling the first direction, where the fourth connection terminals may also be referred as the second chip terminals;

a Display Driver Integrated Circuit (DDIC) 220, located on the flexible film 210, the DDIC being connected respectively to the third connection terminals 211 and the fourth connection terminals 214, and being configured to provide a drive signal to a display panel 100 connected to the chip on film 200.

The chip on film (COF) 200 may be a chip on FPC. That is, the film in the chip on film 200 may be an FPC.

As shown in FIG. 2A and FIG. 2B, the flexible film 210 may include: a bendable film for connection line layout, such as an FPC including a flexible substrate such as a polyimide or a polyester film. The DDIC 220 is pressed and attached to the FPC, forming a COF.

In embodiments of the present disclosure, the second direction is not parallel to the first direction, which includes that: the angle between the first direction and the second direction is an acute angle between 0° and 90°. Alternatively, the angle between the first direction and the second direction is an obtuse angle between 90° and 180°; or the first direction is perpendicular to the second direction, i.e., the angle between the first direction and the second direction is 90°. By orienting the long edges of the third connection terminals 211 and the fourth connection terminals 214 in a nonparallel mode, compared to orienting the long edges of both the third connection terminals 211 and the fourth connection terminals 214 side by side along the first direction, the width occupied by the connection terminals in the first direction is reduced. Such arrangement of the third connection terminals 211 and the fourth connection terminals 214 reduces occupation of space of the flexible film 210. A flexible film 210 of the same size may be provided with more connection terminals, help improving resolution of the display panel 100 when the chip on film 200 is connected to the display panel 100.

Non-restrictively, as shown in FIG. 2A, each connection terminal is roughly shown as a rectangle, with a long edge and a short edge. In actual application, connection terminals arranged in one mode are distributed in one row.

There may be two or more third connection terminals 211 and two or more fourth connection terminals 214. Two or more third connection terminals 211 are arranged into a third terminal row. Two or more fourth connection terminals 214 are arranged into a fourth terminal row. The third terminal row and the fourth terminal row are arranged to form different terminal rows. Multiple terminal rows are arranged side by side along the first direction. Two terminal rows may be distributed on the flexible film 210, i.e., a third terminal row and a fourth terminal row are distributed on the flexible film 210. As shown in FIG. 2A, long edges of all connection terminals in one row are arranged along the first direction, i.e., oriented horizontally. Long edges of connection terminals in the other row are arranged along the second direction, i.e., oriented vertically. Further, three or more terminal rows may be provided as needed. Numbers of the third terminal rows and of the fourth terminal rows may be set separately respectively as needed. At this time, rows of the third connection terminals 211 and rows of the fourth connection terminals 214 may be distributed alternately successively. For example, a first row is counted, starting from the row close to the edge of the flexible film 210 towards the centre of the flexible film 210, followed by the second row, the third row, . . . , and so on. The first row is multiple fourth connection terminals 214 oriented horizontally. The second row is multiple third connection terminals 211 oriented vertically. The third row is multiple fourth connection terminals 214 oriented horizontally. The fourth row is multiple third connection terminals 211 oriented vertically, . . . , and so on. Alternatively, instead of the successive alternate mode, some random rows of connection terminals may be oriented vertically or horizontally, provided that the space of the flexible film 210 can be fully used.

In the first direction, the correspondence between the third connection terminals 211 and the fourth connection terminals 214 is not limited. Non-restrictively, illustrated with the example shown in FIG. 2A, each horizontally oriented fourth connection terminal 214 corresponds to two vertically oriented third connection terminals 211 below. Of course, each horizontally oriented fourth connection terminal 214 may also correspond to one or three vertically oriented third connection terminals 211 below.

In other optional embodiments, the third connection terminals 211 and the fourth connection terminals 214 are located on an edge of the flexible film 210 on a same side. A distance between the third connection terminals 211 and the DDIC 220 may be less than a distance between the fourth connection terminals 214 and the DDIC 220.

As shown in FIG. 2A and FIG. 2B, the fourth connection terminals 214 may be closer to the edge of the flexible film 210. The third connection terminals 211 may be oriented vertically. The fourth connection terminals 214 may be oriented horizontally.

In other optional embodiments, the flexible film 210 includes a first layer and a second layer. The second layer and the first layer may be arranged in a stack.

The third connection terminals 211 and the fourth connection terminals 214 may be located on the first layer of the flexible film 210.

A third connection line 240 connected to the DDIC 220 may be provided on the second layer of the flexible film 210. An insulating layer may be provided between the first layer and the second layer of the flexible film 210.

The fourth connection terminals 214 may be electrically connected to the third connection line 240 through a second via hole 213 passing through both the first layer and the insulating layer.

The number of second via holes 213 may be selected as needed, and is not used as a limit to the present disclosure. Non-restrictively, as shown in FIG. 2A, the number of second via holes 213 may be equal to the number of fourth connection terminals 214. A second via hole 213 may be provided below each fourth connection terminal 214. The fourth connection terminals 214 may be in one-to-one correspondence with the second via holes 213.

As shown in FIG. 2A and FIG. 2B, the region of the flexible film 210 where connection terminals are provided may also be arranged as a double-layer structure, i.e., a D region. The first layer may be the back of the flexible film 210 shown in FIG. 2B. The fourth connection terminals 214 and the third connection terminals 211 in dashed lines represent that they are blocked from view since they are located on the first layer. Third connection lines 240 are configured to implement the electrical connection between the DDIC 220 and the fourth connection terminals 214.

With a second via hole 213, a third connection line 240 may be wired through the second layer, and does not have to go through the first layer, reducing occupation of space on the first layer. Compared to the solution shown in FIG. 2A and FIG. 2B, the third connection line 240 also does not have to pass through the spacing between two adjacent third connection terminals 211 in order to avoid the third connection terminals 211. A third connection line 240 may even coincide with a third connection terminal 211 in the thickness direction of the flexible film 210. As shown in FIG. 2A, the third connection lines 240 may overlap the fourth connection terminals 214. Therefore, in embodiments of the present disclosure, the spacing between adjacent fourth connection terminals 214 on the same row as well as the spacing between two adjacent third connection terminals 211 on the same row may be smaller, saving space in the second direction. More connection terminals may be arranged within the limited space in the second direction, and the connection lines do not have to be arranged all on the first layer, reducing abnormality caused by wiring crosstalk, reducing difficulty in a manufacturing process.

Non-restrictively, both the first layer and the second layer may be insulating membranes. A groove corresponding to a third connection line 240 may be etched on the second layer through a mask. Then, a conductor such as metal may be added into the groove, forming the third connection line. A through hole may be provided on the flexible film 210, and the inner wall of the through hole may be metalized to form the via hole.

In other optional embodiments, the third connection terminals 211 and the fourth connection terminals 214 are spaced apart from one another. A second via hole 213 may be located in spacing between the third connection terminals 211 and the fourth connection terminals 214.

As shown in FIG. 2A, a second via hole 213 may be located below a fourth connection terminal 214, and above a corresponding third connection terminal 211.

Optionally, a second via hole 213 may also be provided directly on a third connection terminal 21, such that the spacing between the third connection terminals 21 and the fourth connection terminals 214 may further be reduced, reducing space in the first direction in the flexible film 210.

In other optional embodiments, a fourth connection line 230 separated from the third connection line 240 is further provided on the second layer. The third connection terminals 211 may be connected to the fourth connection line 230 through a third via hole 212 passing through the first layer. The fourth connection line 230 may be further connected to the DDIC 220.

The number of third via holes 212 may be selected as needed, and is not used as a limit to the present disclosure. Non-restrictively, as shown in FIG. 2A, the number of third via holes 212 may be equal to the number of third connection terminals 211. A third via hole 212 may be provided below each third connection terminal 211. The third connection terminals 211 may be in one-to-one correspondence with the third via holes 212.

A fourth connection line 230 may be configured to implement the electrical connection between the DDIC 220 and a third connection terminal 211. Non-restrictively, as shown in FIG. 2B, when the DDIC 220 is arranged on the second layer, a fourth connection line 230 is connected to a third connection terminal 211 on the first layer through a third vial hole 212 on the flexible film 210, and the fourth connection line 230 does not have to occupy the space of the first layer, saving space of the first layer, increasing the number of connection terminals arranged on the first layer.

Embodiments of the present disclosure further provide display equipment, including:

the display panel 100 according to any foregoing embodiment; and the chip on film 200 according to any foregoing embodiment.

The third connection terminals 211 of the chip on film 200 may be electrically connected to the first connection terminals 121 of the display panel 100.

The fourth connection terminals 214 of the chip on film 200 may be electrically connected to the second connection terminals 123 of the display panel 100.

The display equipment has the advantages of both the display panel 100 and the chip on film 200 of the foregoing embodiments. For example, by orienting the long edges of the first connection terminals 121 and the long edges of the second connection terminals 123 in a nonparallel mode, compared to orienting the long edges of both the first connection terminals 121 and the second connection terminals 123 side by side along the first direction, the width occupied by the connection terminals in the first direction is reduced. The same mode is adopted to optimize arrangement of the third connection terminals 211 and the fourth connection terminals 214 on the flexible film 210. Such arrangements of the first connection terminals 121, the second connection terminals 123, the third connection terminals 211, and the fourth connection terminals 214 reduce space occupation, and all help reducing a border area of the display panel 100, improving a borderless effect and a screen-to-body ratio.

As shown in FIG. 2B, the third connection terminals 211 and the first connection terminals 121 may be fixed and electrically connected by pressing and attaching a conductive glue. The fourth connection terminal 214 and the second connection terminals 123 may be fixed and electrically connected by pressing and attaching a conductive glue.

The display equipment may include but not limited to a mobile phone, a tablet computer, a desktop computer, a monitor, wearable equipment, etc.

In addition to the chip on film 200, also referred to as a COF, the display panel 100 may also use a chip on glass (COG). That is, the flexible film in the chip on film 200 is replaced with glass. The display panel 100 may also use a chip on plastic (COP). That is, the flexible film in the chip on film 200 is replaced with plastic.

In other optional embodiments, a mode of distribution of the third connection terminals 211 of the chip on film 200 is identical to a mode of distribution of the first connection terminals 121 of the display panel 100.

In other optional embodiments, a mode of distribution of the fourth connection terminals 214 of the chip on film 200 is identical to a mode of distribution of the second connection terminals 123 of the display panel 100.

As shown in FIG. 2A and FIG. 2B, long edges of the third connection terminals 211 are oriented along the same direction as long edges of the first connection terminals 121. The third connection terminals and the first connection terminals are in one-to-one correspondence. Likewise, long edges of the fourth connection terminals 214 are oriented along the same direction as long edges of the second connection terminals 123. The fourth connection terminals and the second connection terminals are in one-to-one correspondence. When the chip on film 200 is connected to the edge region 120 of the display panel 100, the third connection terminals 211 fit the first connection terminals 121, and the fourth connection terminals 214 fit the second connection terminals 123.

In a specific example, the display equipment is a mobile phone. The solution is suitable for a mobile phone using a Quarter High Definition (QHD) or UHD display panel 100. As shown in FIG. 2A, when the connection terminals are arranged into two rows, both the display panel 100 and the chip on film 200 are provided with one row of connection terminals oriented horizontally, and one row of connection terminals oriented vertically, saving space. As a connection terminal has a certain length (a value b), in order to optimize the space, it is not recommended to orient both rows of connection terminals horizontally. A bonding region on the chip on film 200 provided with connection terminals also has two layers. When going under a horizontally oriented connection terminal, a connection line passes through a punch hole to reach the first layer (i.e., the bottom layer), ensuring that the connection terminal is located on the first layer. As connection lines on the second layer (i.e., the top layer) and the vertically oriented connection terminals are not located on the same layer, a connection route thereof does not have to be in between two connection terminals, and may coincide with a vertically oriented connection terminal, thereby reducing the distance between the connection terminals, saving the space in the X direction (i.e., the second direction). In this way, more connection terminals may be arranged within the limited space in the X direction, implementing UHD resolution.

Figure 3:
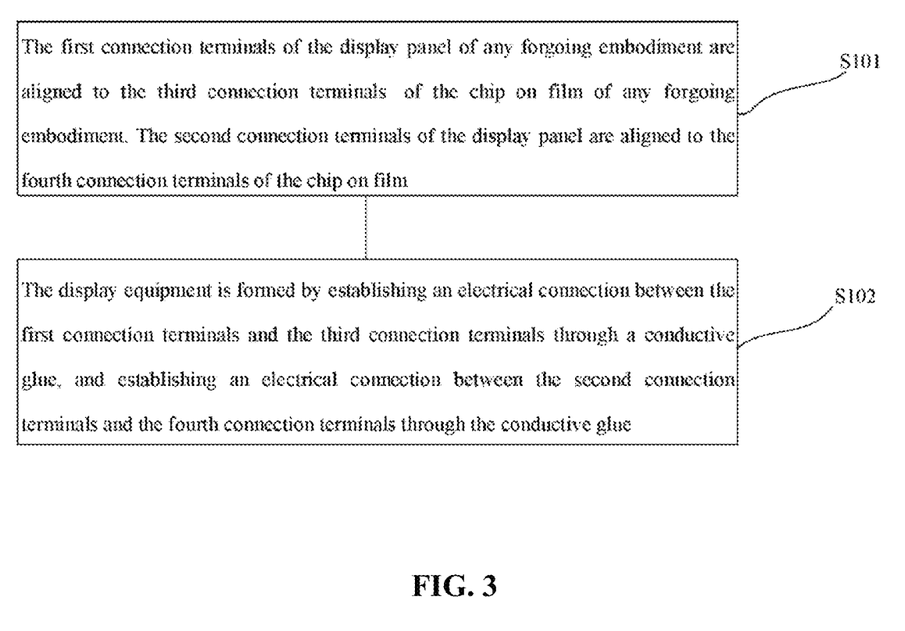
FIG. 3 is a flowchart of a method for manufacturing display equipment according to an exemplary embodiment.

Embodiments of the present disclosure further provide a method for manufacturing display equipment. As shown in FIG. 3, the manufacturing method includes the following steps.

In S101, the first connection terminals 121 of the display panel according to any foregoing embodiment are aligned to the third connection terminals 211 of the chip on film according to any foregoing embodiment. The second connection terminals 123 of the display panel are aligned to the fourth connection terminals 214 of the chip on film.

In S102, the display equipment is formed by establishing an electrical connection between the first connection terminals 121 and the third connection terminals 211 through a conductive glue, and establishing an electrical connection between the second connection terminals 123 and the fourth connection terminals 214 through the conductive glue.

With horizontally oriented second connection terminals 123, the size of the edge region 120 of the display panel 100 in the first direction may be reduced. With horizontally oriented fourth connection terminal 214, the size of the chip on film in the first direction may be reduced. After the display panel has been connected to the chip on film, the size of the edge region 120 below the display region 110 of the display panel 100 may be reduced, increasing the screen-to-body ratio of the display equipment.

Generally, the alignment refers to aligning the upper to the lower. For example, as shown in FIG. 2A, the edge region of the display panel is located above, the chip on film is located below, the third connection terminals 211 on the chip on film are aligned one by one to the first connection terminals 121 of the display panel located above, and the fourth connection terminals 214 on the chip on film are aligned one by one to the second connection terminals 123 of the display panel located above.

In other optional embodiments, the first connection terminals 121 of the display panel according to any foregoing embodiment may be aligned to the third connection terminals 211 of the chip on film according to any foregoing embodiment, and the second connection terminals 123 of the display panel may be aligned to the fourth connection terminals 214 of the chip on film, as follows.

The first connection terminals 121 pasted with the conductive glue may be aligned to the third connection terminals 211.

The second connection terminals 123 pasted with the conductive glue may be aligned to the fourth connection terminals 214.

Before aligning the first connection terminals 121 to the third connection terminals 211, the conductive glue may be pressed onto either the first connection terminals 121 or the second connection terminals 123. Likewise, before aligning the second connection terminals 123 to the fourth connection terminals 214, the conductive glue may be pressed onto either the third connection terminals 211 or the fourth connection terminals 214.

In other optional embodiments, an electrical connection between the first connection terminals 121 and the third connection terminals 211 may be established through a conductive glue, and an electrical connection between the second connection terminals 123 and the fourth connection terminals 214 may be established through the conductive glue, as follows.

The first connection terminals 121 and the third connection terminals 211 may be pressed and aligned. The second connection terminals 123 and the fourth connection terminals 214 may be pressed and aligned. The conductive glue may further encapsulate conductive particles isolated inside colloid. The conductive glue may deform under a pressing force. The conductive particles may be connected to each other, forming the electrical connection between the first connection terminals 121 and the third connection terminals 211, as well as the electrical connection between the second connection terminals 123 and the fourth connection terminals 214.

In actual application, the conductive glue is generally an anisotropic conductive glue. Before being pressed, conductive particles in the conductive glue may be in an isolated state and are not in continuous contact with each other; and the conductive glue may be in an insulating state in each direction. After being pressed, under the influence of the pressure, the conductive particles may be in a continuous state in a thickness direction of the display equipment, implementing the electrical connection between the first connection terminals 121 and the third connection terminals 211, as well as the electrical connection between the second connection terminals 123 and the fourth connection terminals 214.

Conductive particles in the conductive glue may include but not limited to Gold, Silver, Copper, Aluminium, Zinc, Iron, Nickel, etc. The colloid encapsulating the conductive particles may include but not limited to an epoxy resin colloid, an acrylate colloid, a polyurethane colloid, etc.

Features disclosed in product embodiments of the present disclosure may be combined with each other as needed to acquire a new product embodiment, as long as no conflict results from the combination.

According to an embodiment herein, a computer-readable storage medium has stored thereon computer program instructions which, when executed by a processor, implement an option in a method for manufacturing display equipment herein.

Figure 4:
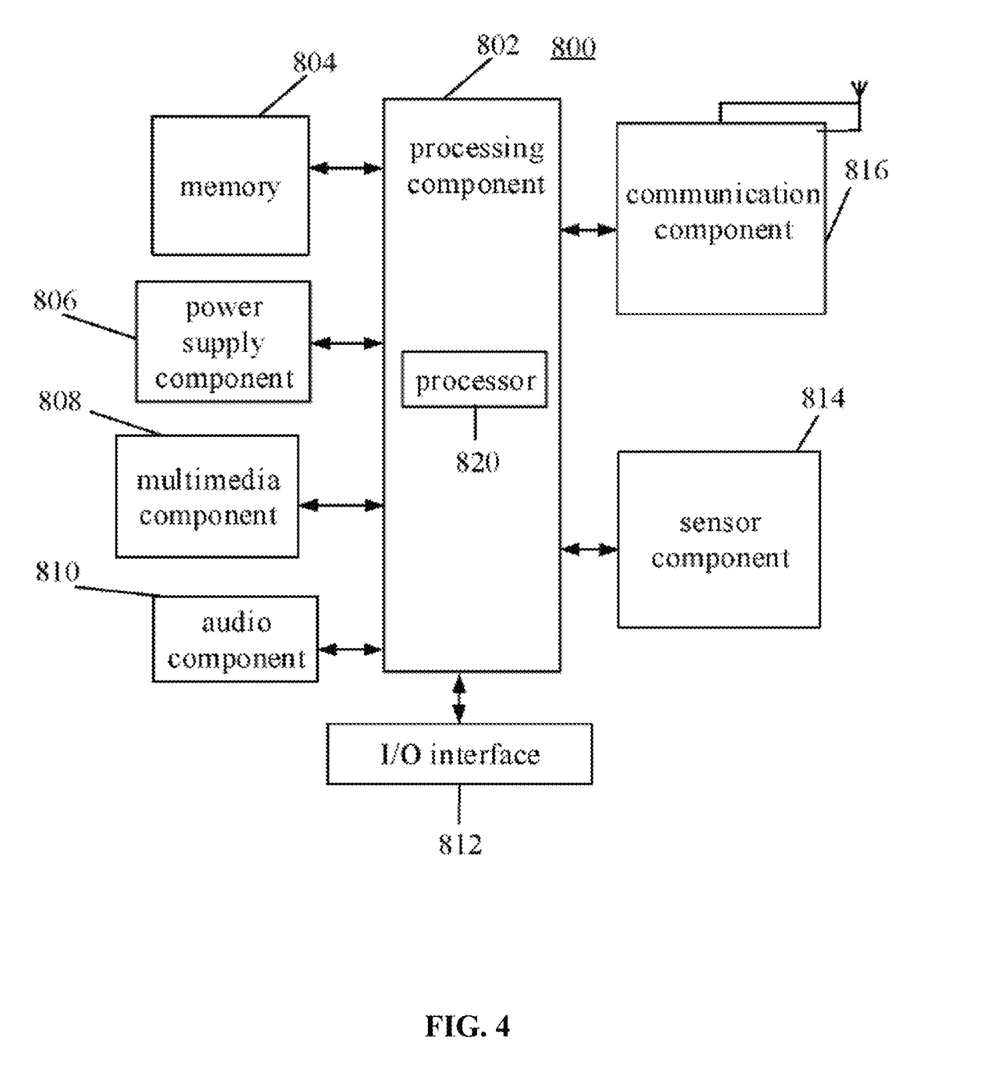
FIG. 4 is a block diagram of a device for manufacturing display equipment according to an exemplary embodiment.

FIG. 4 is a block diagram of a device 800 for manufacturing display equipment according to an exemplary embodiment. For example, the device 800 may be a mobile phone, a computer, digital broadcasting UE, a message transceiver, a game console, tablet equipment, medical equipment, fitness equipment, a personal digital assistant, etc.

Referring to FIG. 4, the device 800 may include at least one of a processing component 802, memory 804, a power supply component 806, a multimedia component 808, an audio component 810, an Input/Output (I/O) interface 812, a sensor component 814, or a communication component 816.

The processing component 802 may generally control an overall operation of the device 800, such as operations associated with display, a telephone call, data communication, a camera operation, a recording operation, etc. The processing component 802 may include one or more processors 820 to execute instructions so as to complete all or part of the options of an aforementioned method. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 may be configured for storing various types of data to support the operation at the device 800. Examples of such data may include instructions of any application or method configured for operating on the device 800, contact data, phonebook data, messages, pictures, videos, etc. The memory 804 may be actualized by any type of transitory or non-transitory storage equipment or a combination thereof, such as Static Random Access Memory (SRAM), Electrically Erasable Programmable Read-Only Memory (EEPROM), Erasable Programmable Read-Only Memory (EPROM), Programmable Read-Only Memory (PROM), Read-Only Memory (ROM), magnetic memory, flash memory, a magnetic disk, a compact disk, etc.

The power supply component 806 may supply electric power to various components of the device 800. The power supply component 806 may include a power management system, one or more power sources, and other components related to generating, managing, and distributing electricity for the device 800.

The multimedia component 808 may include a screen that provides an output interface between the device 800 and a user. The screen may include a Liquid Crystal Display (LCD) and a Touch Panel (TP). If the screen may include a TP, the screen may be actualized as a touch screen to receive a signal input by a user. The TP may include one or more touch sensors for sensing touch, slide, and gestures on the TP. The one or more touch sensors not only may sense the boundary of a touch or slide move, but also detect the duration and pressure related to the touch or slide move. The multimedia component 808 may include at least one of a front camera or a rear camera. When the device 800 is in an operation mode such as a photographing mode or a video mode, at least one of the front camera or the rear camera may receive external multimedia data. Each of the front camera or the rear camera may be a fixed optical lens system or may have a focal length and be capable of optical zooming.

The audio component 810 may be configured for outputting and/or inputting an audio signal. For example, the audio component 810 may include a microphone (MIC). When the device 800 is in an operation mode such as a call mode, a recording mode, a voice identification mode, etc., the MIC may be configured for receiving an external audio signal. The received audio signal may be further stored in the memory 804 or may be sent via the communication component 816. The audio component 810 may further include a loudspeaker configured for outputting the audio signal.

The I/O interface 812 may provide an interface between the processing component 802 and a peripheral interface module. Such a peripheral interface module may be a keypad, a click wheel, a button, etc. Such a button may include but is not limited to at least one of a homepage button, a volume button, a start button, or a lock button.

The sensor component 814 may include one or more sensors for assessing various states of the device 800. For example, the sensor component 814 may detect an on/off state of the device 800 and relative location of components such as the display and the keypad of the device 800. The sensor component 814 may further detect a change in the location of the device 800 or of a component of the device 800, whether there is contact between the device 800 and a user, the orientation or acceleration/deceleration of the device 800, a change in the temperature of the device 800, etc. The sensor component 814 may include a proximity sensor configured for detecting existence of a nearby object without physical contact. The sensor component 814 may further include an optical sensor such as a Complementary Metal-Oxide-Semiconductor (CMOS) or a Charge-Coupled-Device (CCD) image sensor used in an imaging application. The sensor component 814 may further include an acceleration sensor, a gyroscope sensor, a magnetic sensor, a pressure sensor, a temperature sensor, etc.

The communication component 816 may be configured for facilitating wired or wireless communication between the device 800 and other equipment. The device 800 may access a wireless network based on a communication standard such as Wi-Fi, 2G, 3G, . . . , or a combination thereof. The communication component 816 may broadcast related information or receive a broadcast signal from an external broadcast management system via a broadcast channel. The communication component 816 may include a Near Field Communication (NFC) module for short-range communication. For example, the NFC module may be based on technology such as Radio Frequency Identification (RFID), Infrared Data Association (IrDA), Ultra-Wideband (UWB) technology, Bluetooth (BT), etc.

The device 800 may be actualized by one or more electronic components such as an Application Specific Integrated Circuit (ASIC), a Digital Signal Processor (DSP), a Digital Signal Processing Device (DSPD), a Programmable Logic Device (PLD), a Field Programmable Gate Array (FPGA), a controller, a microcontroller, a microprocessor, etc., to implement an aforementioned method.

A transitory or non-transitory computer-readable storage medium including instructions, such as memory 804 including instructions, may be provided. The instructions may be executed by the processor 820 of the device 800 to implement an aforementioned method. For example, the computer-readable storage medium may be Read-Only Memory (ROM), Random Access Memory (RAM), Compact Disc Read-Only Memory (CD-ROM), a magnetic tape, a floppy disk, optical data storage equipment, etc.

In another exemplary embodiment, a computer program product may include a computer program that can be executed by a device capable of programming. The computer program may have a code part which, when executed by the programming device, implements a method for manufacturing display equipment herein.

Further note that herein by "multiple", it may mean two or more. Other quantifiers may have similar meanings. A term "and/or" may describe an association between associated objects, indicating three possible relationships. For example, by A and/or B, it may mean that there may be three cases, namely, existence of but A, existence of both A and B, or existence of but B. A slash mark "I" may generally denote an "or" relationship between two associated objects that come respectively before and after the slash mark. Singulars "a/an", "said" and "the" are intended to include the plural form, unless expressly illustrated otherwise by context.

Further note that although in drawings herein operations are described in a specific or der, it should not be construed as that the operations have to be performed in the specific or der or sequence, or that any operation shown has to be performed in or der to acquire an expected result. Under a specific circumstance, multitask and parallel processing may be advantageous.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

According to an aspect of the present disclosure, a display panel is provided, including:

a plurality of first connection terminals, the first connection terminals being arranged into a first terminal row along a second direction, long edges of the first connection terminals being oriented along a first direction; and a plurality of second connection terminals, the second connection terminals being arranged into a second terminal row along the second direction, long edges of the second connection terminals being oriented along the second direction. The first terminal row and the second terminal row are arranged side by side along the first direction. The second direction does not parallel the first direction.

The first connection terminals and the second connection terminals are connected respectively to different display rows or display columns within a display region of the display panel, and are configured respectively to receive a drive signal driving display by the display panel.

In some embodiments, the display panel further includes:

an edge region, located outside the display region.

Both the first connection terminals and the second connection terminals may be located within the edge region.

In some embodiments, a first via hole is formed in the edge region.

Both the first connection terminals and the second connection terminals may be located on a first surface of the edge region.

A distance between the first connection terminals and the display region may be greater than a distance between the second connection terminals and the display region.

The first connection terminals may be connected, through the first vial hole, to a first connection line located on a second surface of the edge region. The first connection line may be connected to the display rows or the display columns. The second surface may be an opposite surface of the first surface.

In some embodiments, the first connection terminals and the second connection terminals are spaced apart from one another.

The first via hole may be located in spacing between the first connection terminals and the second connection terminals.

In some embodiments, the second connection terminals are connected to the display rows or the display columns through a second connection line. The second connection line may be located on a second surface or a first surface of the edge region.

According to an aspect of the present disclosure, a chip on film is provided, including:

a flexible film;

a plurality of third connection terminals, located on the flexible film, the third connection terminals being arranged into a third terminal row along a second direction, long edges of the third connection terminals being oriented along a first direction;

a plurality of fourth connection terminals, located on the flexible film, the fourth connection terminals being arranged into a fourth terminal row along the second direction, long edges of the fourth connection terminals being oriented along the second direction, the third terminal row and the fourth terminal row being arranged side by side along the first direction, the second direction not paralleling the first direction; and a Display Driver Integrated Circuit (DDIC), located on the flexible film. The DDIC is connected respectively to the third connection terminals and the fourth connection terminals, and is configured to provide a drive signal to a display panel connected to the chip on film.

In some embodiments, the third connection terminals and the fourth connection terminals are located on an edge of the flexible film on a same side. A distance between the third connection terminals and the DDIC may be less than a distance between the fourth connection terminals and the DDIC.

In some embodiments, the flexible film includes a first layer and a second layer. The second layer and the first layer may be arranged in a stack.

The third connection terminals and the fourth connection terminals may be located on the first layer of the flexible film.

A third connection line connected to the DDIC may be provided on the second layer of the flexible film. An insulating layer may be provided between the first layer and the second layer of the flexible film.

The fourth connection terminals may be electrically connected to the third connection line through a second via hole passing through both the first layer and the insulating layer.

In some embodiments, the third connection terminals and the fourth connection terminals are spaced apart from one another. The second via hole may be located in spacing between the third connection terminals and the fourth connection terminals.

In some embodiments, a fourth connection line separated from the third connection line is further provided on the second layer. The third connection terminals may be connected to the fourth connection line through a third via hole passing through the first layer. The fourth connection line may be further connected to the DDIC.

According to an aspect of the present disclosure, Display equipment is provided, including:

the display panel of any foregoing embodiment; and the chip on film of any foregoing embodiment.

The third connection terminals of the chip on film are electrically connected to the first connection terminals of the display panel.

The fourth connection terminals of the chip on film are electrically connected to the second connection terminals of the display panel.

In some embodiments, a mode of distribution of the third connection terminals of the chip on film is identical to a mode of distribution of the first connection terminals of the display panel.

A mode of distribution of the fourth connection terminals of the chip on film may be identical to a mode of distribution of the second connection terminals of the display panel.

According to an aspect of the present disclosure, a method for manufacturing display equipment is provided, including:

aligning the first connection terminals of the display panel of any foregoing embodiment to the third connection terminals of the chip on film of any foregoing embodiment, and aligning the second connection terminals of the display panel to the fourth connection terminals of the chip on film; and forming the display equipment by establishing an electrical connection between the first connection terminals and the third connection terminals through a conductive glue, and establishing an electrical connection between the second connection terminals and the fourth connection terminals through the conductive glue.

In some embodiments, aligning the first connection terminals of the display panel of any foregoing embodiment to the third connection terminals of the chip on film of any foregoing embodiment, and aligning the second connection terminals of the display panel to the fourth connection terminals of the chip on film includes:

aligning the first connection terminals pasted with the conductive glue to the third connection terminals; and aligning the second connection terminals pasted with the conductive glue to the fourth connection terminals.

In some embodiments, establishing the electrical connection between the first connection terminals and the third connection terminals through the conductive glue, and establishing the electrical connection between the second connection terminals and the fourth connection terminals through the conductive glue includes:

pressing and aligning the first connection terminals and the third connection terminals, and pressing and aligning the second connection terminals and the fourth connection terminals. The conductive glue may further encapsulate conductive particles isolated inside colloid. The conductive glue may deform under a pressing force. The conductive particles may be connected to each other, forming the electrical connection between the first connection terminals and the third connection terminals, as well as the electrical connection between the second connection terminals and the fourth connection terminals.

A technical solution provided by embodiments of the present disclosure may include beneficial effects as follows.

As can be seen from the above embodiments, by orienting the long edges of the first connection terminals and the long edges of the second connection terminals in a nonparallel mode, compared to orienting the long edges of both the first connection terminals and the second connection terminals side by side along the first direction, the width occupied by the connection terminals in the first direction is reduced. Such arrangement of the first connection terminals and the second connection terminals reduces space occupation, reducing an area of a lower border of the display panel, improving a borderless effect and a screen-to-body ratio.

What is claimed is:

1. A display panel, comprising a plurality of first connection terminals and a plurality of second connection terminals,
wherein long edges of the first connection terminals are oriented along a first direction, wherein the first connection terminals are arranged into a first terminal row along a second direction, wherein the first connection terminals are configured to be respectively aligned with and press against first chip terminals of a chip on film external to the display panel through a conductive glue, forming electrical connection between the first connection terminals and the first chip terminals,
wherein the second connection terminals are arranged into a second terminal row along the second direction, wherein long edges of the second connection terminals are oriented along the second direction, wherein the first terminal row and the second terminal row are arranged side by side along the first direction, and wherein the second direction are not parallel to the first direction, wherein the second connection terminals are configured to be respectively aligned with and press against second chip terminals of the chip on film external to the display panel through the conductive glue, forming electrical connection between the second connection terminals and the second chip terminals,
wherein the first connection terminals and the second connection terminals are connected respectively to display rows or display columns within a display region of the display panel, and are configured to receive a drive signal provided by a Display Driver Integrated Circuit (DDIC) of the chip on film external to the display panel respectively through the first chip terminals and the second chip terminals electrically connected, and transmit the drive signal respectively to the display rows and the display columns within the display region to drive display by the display panel.

2. The display panel of claim 1, further comprising:
an edge region, located outside the display region,
wherein both the first connection terminals and the second connection terminals are located within the edge region.

3. The display panel of claim 2, wherein a first via hole is in the edge region,
both the first connection terminals and the second connection terminals being located on a first surface of the edge region,
a distance between the first connection terminals and the display region being greater than a distance between the second connection terminals and the display region,
the first connection terminals being connected, through the first vial hole, to a first connection line located on a second surface of the edge region, the first connection line being connected to the display rows or the display columns, the second surface being an opposite surface of the first surface.

4. The display panel of claim 3, wherein the first connection terminals and the second connection terminals are spaced apart from one another,
the first via hole being located in spacing between the first connection terminals and the second connection terminals.

5. The display panel of claim 2, wherein the second connection terminals are connected to the display rows or the display columns through a second connection line.

6. Display equipment, comprising: the display panel of claim 1; and the chip on film,
the chip on film further comprising a flexible film,
wherein the first chip terminals are located on the flexible film, and are arranged into a third terminal row along the second direction, wherein long edges of the first chip terminals are oriented along the first direction, the first chip terminals being electrically connected to the first connection terminals by being respectively aligned with and pressing against the first connection terminals through the conductive glue,
wherein the second chip terminals are located on the flexible film, and are arranged into a fourth terminal row along the second direction, wherein long edges of the second chip terminals are oriented along the second direction, the second chip terminals being electrically connected to the second connection terminals by being respectively aligned with and pressing against the second connection terminals through the conductive glue,
wherein the third terminal row and the fourth terminal row are arranged side by side along the first direction, the second direction not paralleling the first direction,
wherein the DDIC is located on the flexible film, is connected respectively to the first chip terminals and the second chip terminals, and is configured to provide the drive signal to the display panel through the first chip terminals and the first connection terminals electrically connected to each other, as well as the second chip terminals and the second connection terminals electrically connected to each other.

7. The display equipment of claim 6, wherein a mode of distribution of the first chip terminals of the chip on film is identical to a mode of distribution of the first connection terminals of the display panel,
a mode of distribution of the second chip terminals of the chip on film being identical to a mode of distribution of the second connection terminals of the display panel.

8. A method for manufacturing display equipment, comprising:
aligning the first connection terminals of the display panel of claim 1 to the first chip terminals of the chip on film, and aligning the second connection terminals of the display panel to the second chip terminals of the chip on film; and
forming the display equipment by establishing the electrical connection between the first connection terminals and the first chip terminals through the conductive glue, and establishing the electrical connection between the second connection terminals and the second chip terminals through the conductive glue,
the chip on film further comprising a flexible film,
wherein the first chip terminals are located on the flexible film, and are arranged into a third terminal row along the second direction, wherein long edges of the first chip terminals are oriented along the first direction,
wherein the second chip terminals are located on the flexible film, and are arranged into a fourth terminal row along the second direction, wherein long edges of the second chip terminals are oriented along the second direction,
wherein the third terminal row and the fourth terminal row are arranged side by side along the first direction, the second direction not paralleling the first direction,
wherein the DDIC is located on the flexible film, is connected respectively to the first chip terminals and the second chip terminals, and is configured to provide the drive signal to the display panel through the first chip terminals and the first connection terminals electrically connected to each other, as well as the second chip terminals and the second connection terminals electrically connected to each other.

9. The method of claim 8, wherein aligning the first connection terminals of the display panel to the first chip terminals of the chip on film, and aligning the second connection terminals of the display panel to the second chip terminals of the chip on film comprises:
aligning the first connection terminals pasted with the conductive glue to the first chip terminals; and
aligning the second connection terminals pasted with the conductive glue to the second chip terminals.

10. The method of claim 9, wherein establishing the electrical connection between the first connection terminals and the first chip terminals through the conductive glue, and establishing the electrical connection between the second connection terminals and the second chip terminals through the conductive glue comprises:
pressing and aligning the first connection terminals and the first chip terminals, and pressing and aligning the second connection terminals and the second chip terminals, the conductive glue further encapsulates conductive particles isolated inside colloid, the conductive glue deforming under a pressing force, the conductive particles being connected to each other, forming the electrical connection between the first connection terminals and the first chip terminals, as well as the electrical connection between the second connection terminals and the second chip terminals.

11. A chip on film, comprising a flexible film, a plurality of first chip terminals, a plurality of second chip terminals, and a Display Driver Integrated Circuit (DDIC),
wherein the first chip terminals are located on the flexible film, and are arranged into a third terminal row along a second direction, wherein long edges of the first chip terminals are oriented along a first direction, wherein the first chip terminals are configured to be respectively aligned with and press against first connection terminals of a display panel external to the chip on film through a conductive glue, forming electrical connection between the first connection terminals and the first chip terminals,
wherein the second chip terminals are located on the flexible film, and are arranged into a fourth terminal row along the second direction, wherein long edges of the second chip terminals are oriented along the second direction, wherein the second chip terminals are configured to be respectively aligned with and press against second connection terminals of the display panel external to the chip on film through the conductive glue, forming electrical connection between the second connection terminals and the second chip terminals,
wherein the third terminal row and the fourth terminal row are arranged side by side along the first direction, the second direction not paralleling the first direction,
wherein the DDIC is located on the flexible film, is connected respectively to the first chip terminals and the second chip terminals, and is configured to provide a drive signal to the display panel external to the chip on film through the first chip terminals and the first connection terminals electrically connected to each other, as well as the second chip terminals and the second connection terminals electrically connected to each other.

12. The chip on film of claim 11, wherein the first chip terminals and the second chip terminals are located on an edge of the flexible film on a same side, a distance between the first chip terminals and the DDIC being less than a distance between the second chip terminals and the DDIC.

13. The chip on film of claim 12, wherein a fourth connection line separated from the third connection line is further provided on the second layer, the first chip terminals being connected to the fourth connection line through a third via hole passing through the first layer, the fourth connection line being further connected to the DDIC.

14. The chip on film of claim 11, wherein the flexible film comprises a first layer and a second layer, the second layer and the first layer being arranged in a stack,
the first chip terminals and the second chip terminals being located on the first layer of the flexible film,
wherein a third connection line connected to the DDIC is provided on the second layer of the flexible film, wherein an insulating layer is provided between the first layer and the second layer of the flexible film,
the second chip terminals being electrically connected to the third connection line through a second via hole passing through both the first layer and the insulating layer.

15. The chip on film of claim 14, wherein the first chip terminals and the second chip terminals are spaced apart from one another, the second via hole being located in spacing between the first chip terminals and the second chip terminals.

\* \* \* \* \*